United States Patent
Fang et al.

(10) Patent No.: US 8,923,601 B2
(45) Date of Patent: Dec. 30, 2014

(54) METHOD FOR INSPECTING OVERLAY SHIFT DEFECT DURING SEMICONDUCTOR MANUFACTURING AND APPARATUS THEREOF

(75) Inventors: Wei Fang, Milpitas, CA (US); Hong Xiao, Pleasanton, CA (US); Jack Jau, Los Altos Hills, CA (US)

(73) Assignee: Hermes Microvision Inc., Hsinchu (TW)

( * ) Notice: Subject to any disclaimer, the term of this patent is extended or adjusted under 35 U.S.C. 154(b) by 78 days.

(21) Appl. No.: 13/240,721

(22) Filed: Sep. 22, 2011

(65) Prior Publication Data

US 2012/0070067 A1     Mar. 22, 2012

Related U.S. Application Data

(63) Continuation-in-part of application No. 12/433,762, filed on Apr. 30, 2009, now Pat. No. 8,050,490.

(51) Int. Cl.
    *G06K 9/00*      (2006.01)
    *G01N 23/00*      (2006.01)
    *G03F 7/20*      (2006.01)

(52) U.S. Cl.
    CPC ................................ *G03F 7/70633* (2013.01)
    USPC ........................... 382/151; 382/145; 250/306

(58) Field of Classification Search
USPC .......... 382/151, 100, 141, 145; 250/306–311, 250/491.1, 397, 492.2, 396 R, 396 ML, 250/341.1, 398; 356/394, 388, 400, 401; 702/84, 1, 81
See application file for complete search history.

(56) References Cited

U.S. PATENT DOCUMENTS

| | | | |
|---|---|---|---|
| 6,353,219 B1 * | 3/2002 | Kley | 250/234 |
| 6,597,002 B1 * | 7/2003 | Kondo | 250/492.2 |
| 7,095,885 B1 * | 8/2006 | DeLaRosa et al. | 382/151 |
| 7,439,502 B2 * | 10/2008 | Nakasuji et al. | 250/306 |
| 7,485,856 B2 * | 2/2009 | Kley | 250/306 |
| 8,050,490 B2 * | 11/2011 | Xiao et al. | 382/151 |
| 2005/0089773 A1 * | 4/2005 | Shur et al. | 430/22 |

* cited by examiner

*Primary Examiner* — Sheela Chawan
(74) *Attorney, Agent, or Firm* — WPAT, PC; Justin King

(57) ABSTRACT

A method for inspecting overlay shift defect during semiconductor manufacturing is disclosed herein and includes a step for providing a charged particle microscopic image of a sample, a step for identifying an inspection pattern measure in the charged particle microscopic image, a step for averaging the charged particle microscopic image by using the inspection pattern measure to form an averaged inspection pattern measure, a step for estimating an average width from the averaged inspection pattern measure, and a step for comparing the average width with a predefined threshold value to determine the presence of the overlay shift defect.

25 Claims, 14 Drawing Sheets

METHOD FOR INSPECTING OVERLAY SHIFT DEFECT DURING SEMICONDUCTOR MANUFACTURING AND APPARATUS THEREOF

CROSS-REFERENCE TO RELATED APPLICATIONS

This application is a continuation-in-part of U.S. application Ser. No. 12/433,762, filed on Apr. 30, 2009, the entire contents of which are incorporated herein by reference.

BACKGROUND OF THE INVENTION

1. Field of the Invention

The present invention is related to a method for inspecting overly shift defect during semiconductor manufacture and apparatus thereof, and more particularly, is related to a method for inspecting overlay shift between contact/via plugs and metal lines in a semiconductor device using charged particle beam imaging.

2. Description of Related Art

Overlay shift is a common defect which occurs during the manufacture of semiconductor devices (such as an integrated circuit). One of the major causes of the overlay shift defect is the misalignment of photolithography masks for forming two successive layers within a semiconductor device. FIG. 1 is a cross sectional view showing the overlay shift defect in a semiconductor device. As shown in FIG. 1, overlay shift defects could happen in various layers of a semiconductor device, for example at the location between a contact plug 104 and a first layer metal line 102 or the location between a via plug 108 and a second layer metal line 106. Because of overlay shifting, the formed metal lines fail to be aligned with the underneath contact/via plugs after etching. This would result in a high contact resistance between these elements. Such resistance can cause malfunction of the entire device, for example, a disconnected source/drain contact plug with the corresponding bit line can obstruct the operation of a DRAM device.

Another issue brought along by this type of defect is the manufacturing cost. As a semiconductor device is generally fabricated in a layer-by-layer fashion with one layer on top of another, a defective plug-to-contact layer should be reported immediately to stop the process so that further waste can be avoided.

Currently, the inspection of defects on a semiconductor sample is mostly carried out through charged particle beam imaging of the sample. FIG. 2 is a schematic illustration of a charged particle beam microscope system 200 according to the conventional art. A charged particle beam source 210 generates a charged particle beam, and then the charged particle beam is condensed and focused by a condenser lens module 220 and an objective lens module 230, respectively, to form a charged particle beam probe 240. The formed charged particle beam probe 240 then bombards the surface of a sample 295 secured on a stage 290. Charged particle beam probe 240 is controlled by a deflection module 250 to scan the surface of sample 295. After charged particle beam probe 240 bombards the surface of sample 295, secondary charged particles 260 are induced to emit from the sample surface along with other charged particles of beam probe 240 reflected by sample 295. These particles are then detected and collected by a detector module 270. Then, detector module 270 generates a detection signal 271 accordingly. An image forming module 280 coupled to detector module 270 then receives detection signal 271 and accordingly forms a charged particle microscopic image of sample 295. In one example, the charged particle is electron.

The overlay shift defect is, however, difficult to be examined by the existing charged particle beam inspection method/tools. Currently, monitoring of this defect is typically through human observation and interpretation of a top-down view charged particle microscopic image of the sample, and the result is more or less arbitrary and the accuracy is poor.

Therefore, it is desirable to have a method for reliably, in-time reporting the presence of the overlay shift defect after formation of a metal line on top of a contact/via plug, typically by an etching process, in a semiconductor device for the purpose of manufacture process control.

SUMMARY OF THE INVENTION

In view of the foregoing, one feature of the present invention is to provide a method for inspecting overlay shift defect during semiconductor manufacture in order to find out the overlay shift defect more efficiently.

Another feature of the present invention is to increase the accuracy of inspection of the overlay shift defect thereby avoiding unnecessary waste in semiconductor manufacture.

According to the features above, a method for inspecting overlay shift defect during semiconductor manufacture is disclosed herein and includes a step for providing a charged particle microscopic image of a sample, a step for identifying an inspection pattern period in the charged particle microscopic image, a step for averaging the charged particle microscopic image, taking the identified inspection pattern period as a unit, to reduce the image into an averaged inspection pattern period, a step for estimating an average width of the averaged inspection pattern period, and a step for comparing the average width with a predefined threshold value to determine the presence of the overlay shift defect.

According to the features above, a charged particle beam inspection system is disclosed herein which at least includes an image forming apparatus and an image analysis apparatus. The image forming apparatus forms charged particle microscopic images of a sample. The image analysis apparatus is coupled to the image forming apparatus to receive the charged particle microscopic images therefrom. The image analysis apparatus at least comprises a pattern identifying member, an image averaging member, an estimating member and a defect determination member. The pattern identifying member is used to indentify an inspection pattern period from the charge particle microscopic image. The image averaging member is used to average the charged particle microscopic image, using the inspection pattern period a unit, so as to reduce the charged particle microscopic image into an averaged inspection pattern period. The estimating member is used to estimate an average width of the averaged inspection pattern period. And the defect determination member is for determining the presence of an overlay shift defect from the charged particle microscopic image by comparing the estimated average width of the averaged inspection pattern period with a predefined threshold value.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed description of the present invention will be discussed in the following embodiments, which are not intended to limit the scope of the present invention, and can be adapted for other applications. While drawings are illustrated in detail, it is appreciated that the quantity of the disclosed components may be greater or less than that disclosed, except where expressly restricting the amount of the components.

Figure 2:
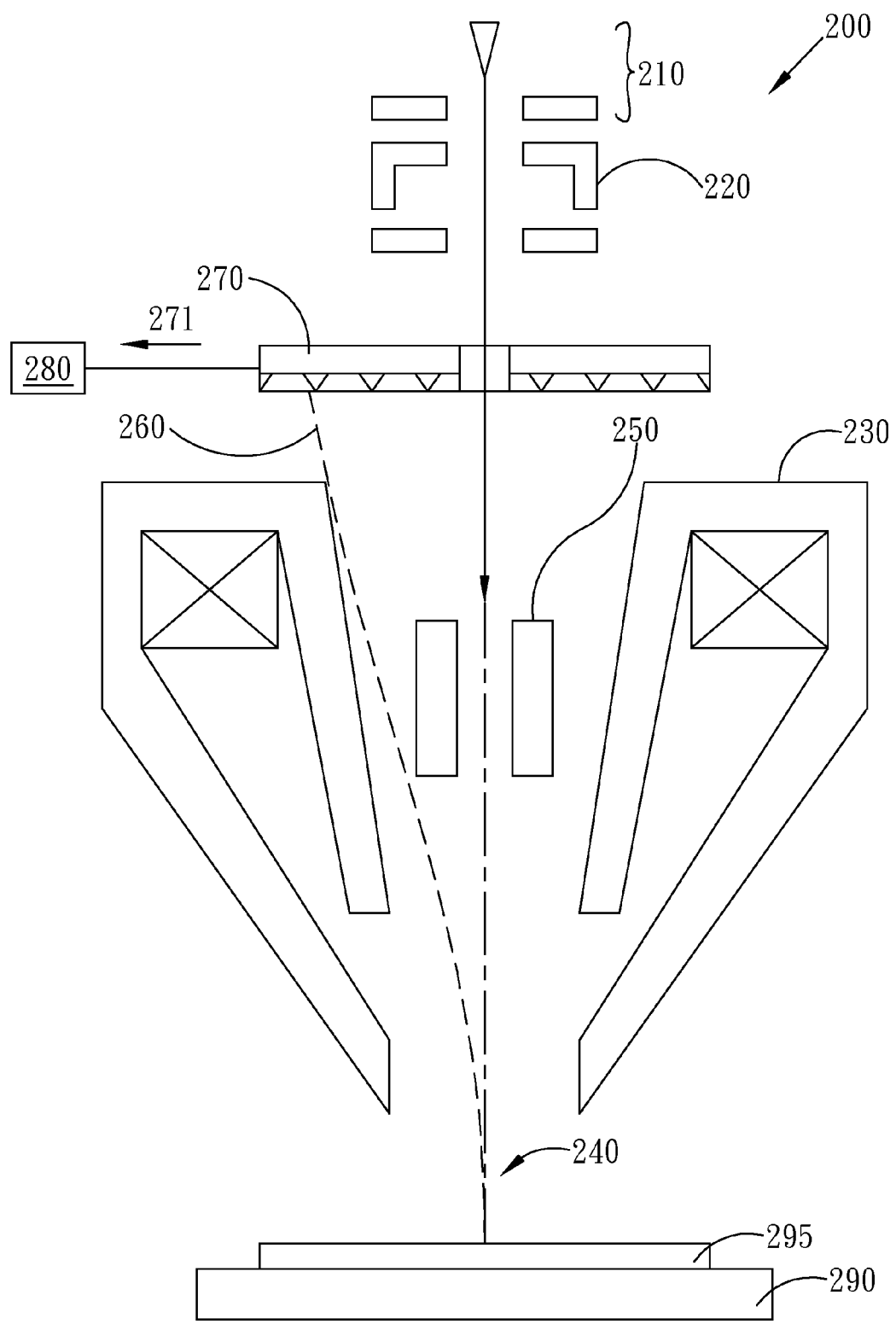
FIG. 2 is a schematic illustration of a charged particle beam microscope system according to the conventional art.

As mentioned earlier, one of the major causes of the overlay shift defect is the misalignment of photolithography masks for forming two successive layers within a semiconductor device. Accordingly, in one embodiment of the present invention, a method for inspecting misalignment of photolithographic masks from a charged particle microscopic image is disclosed. The charged particle microscopic image may be obtained by a conventional charged particle microscope system such as that described above in conjunction with FIG. 2. Refer to FIG. 3A-FIG. 3F and FIG. 4, which are, respectively, an illustration of the execution and flowchart of the proposed inspection method.

Figure 1:
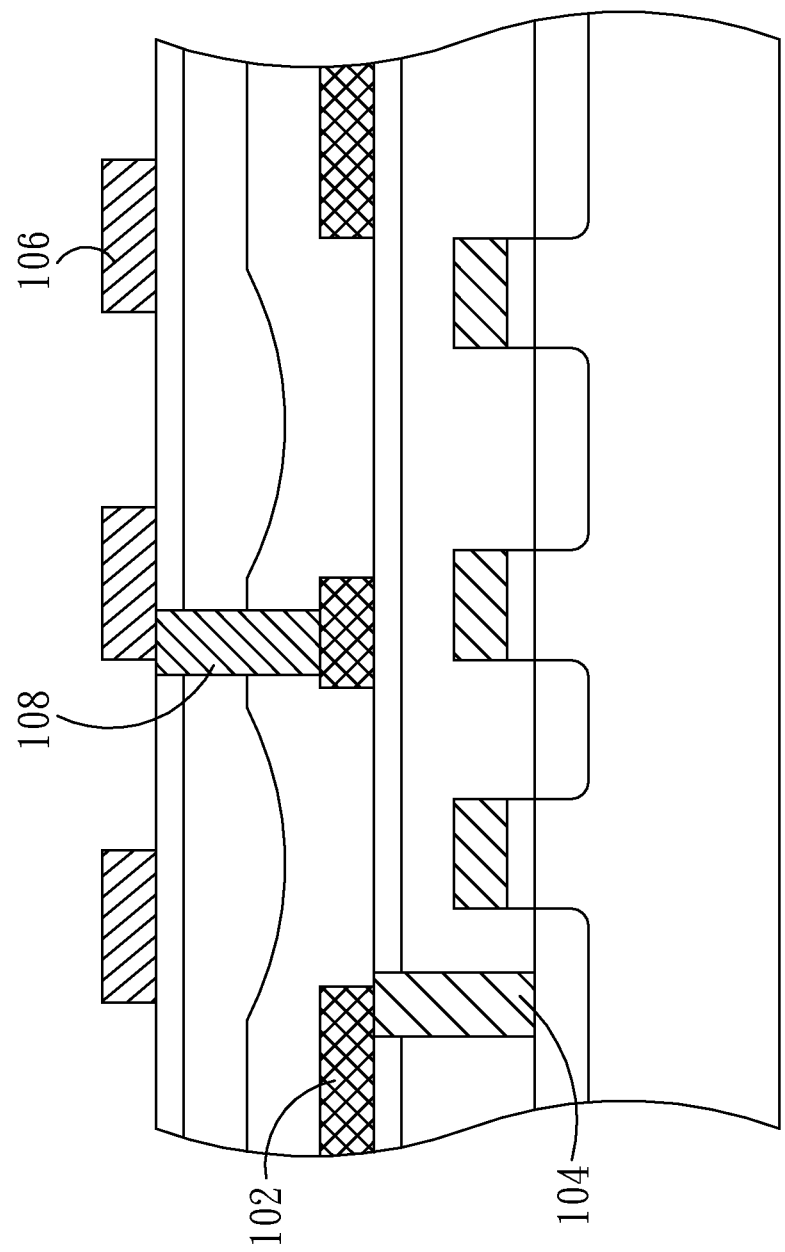
FIG. 1 is a cross sectional view showing the overlay shift defect in a semiconductor device.
Figure 3A:
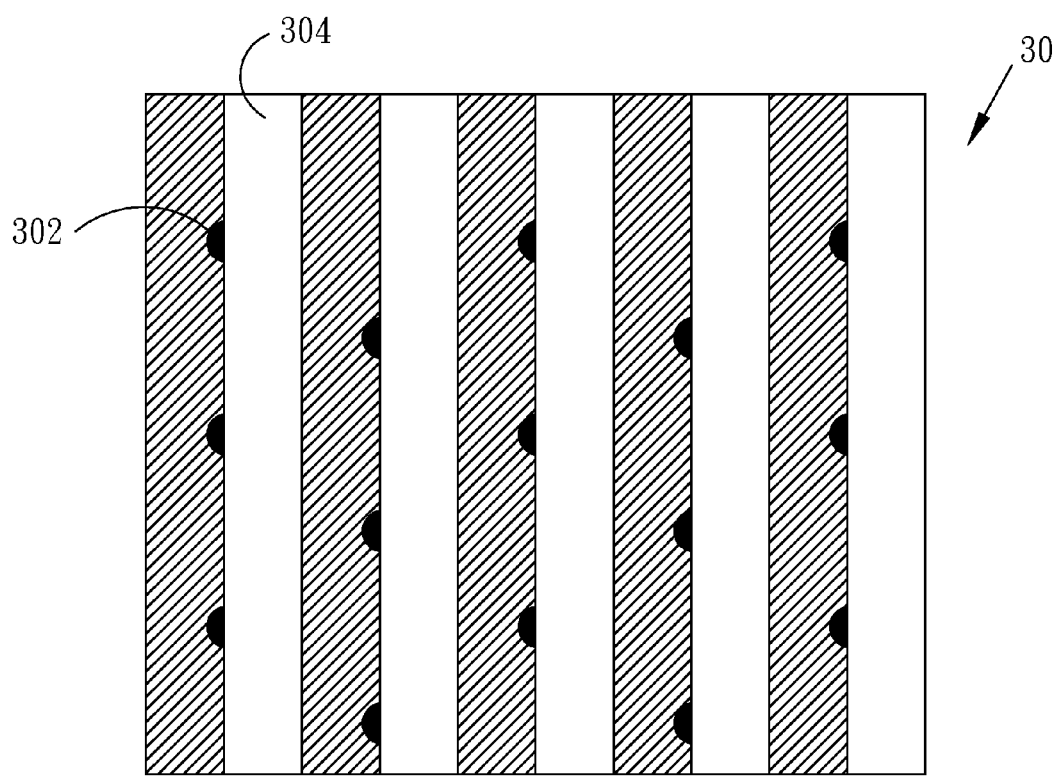
FIG. 3A-FIG. 3F illustrate the execution of a method for inspection of overlay shift defect in accordance with an embodiment of the present invention.

FIG. 3A is a top view schematic showing a charged particle microscopic image of a wafer. The charged particle microscopic image 30 represents top view of a layered structure such as that in FIG. 1 in order to detect the overlay shift defect between a contact/via plug and a metal line in a semiconductor device, for example a dynamic random access memory (DRAM). As shown in FIG. 3A, microscopic image 30 comprises protruding elements 302 extending from line elements 304. This is because of the inaccuracy in aligning the successive masks during formation of the structures represented by elements 302 and 304. In other words, overlay shift is typically unavoidable, it is the degree of shift that is estimated to determine whether a "defect" is present. The protruding elements 302 and the line elements 304 in the charged particle microscope image 30 respectively represent the via/contact plugs and metal lines in the semiconductor device sample. It is noted that microscopic image 30 in FIG. 3A is a high resolution charged particle microscopic image of the sample. In practice, it may also be in other formats such as a voltage contrast (VC) image, where elements 302 and 304 are represented in pixel grey levels.

For the purpose of detecting the overlay shift defect (misalignment of photolithographic masks), one of the advantages of the proposed method is to eliminate human interpretation of charged particle microscopic images of the sample being inspected, but employing imaging processing approaches to instead achieve the same goal of inspection. To do this, an important step is to identify a repeating pattern period unit from the image, so that further analysis of this unit can be carried out through image processing. This can be done in two ways: (1) projecting the imaged pattern (elements 302 and 304) to at least two arbitrary axes, for example the x and y axis shown in FIG. 3B, to identify a pattern period along respective axis, or (2) if a pattern specification, for example a GDS file or database layout of the sample being inspected is available, the specification can be used as a reference to identify pattern periods, for example again respectively along at least two arbitrary axes, such as the x and y axis shown in FIG. 3B. Then, a proper inspection pattern period can be identified by observing these sub-pattern periods.

Figure 3B:
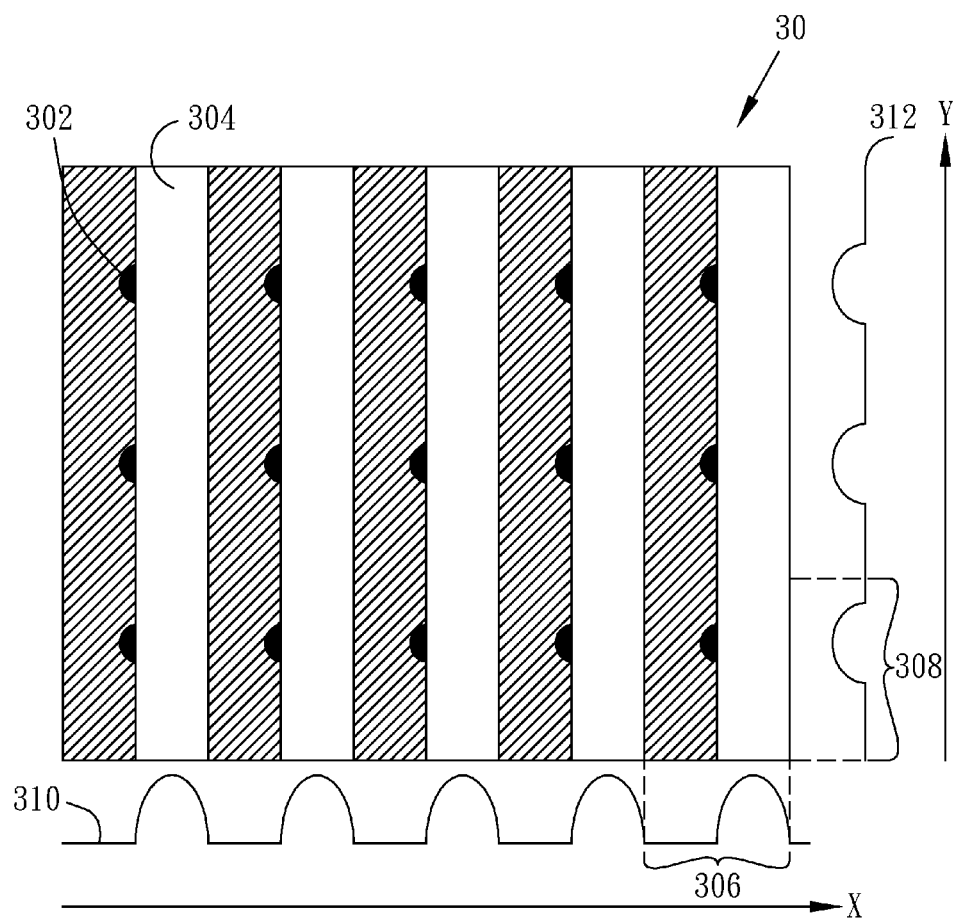

Referring to FIG. 3B, which illustrates the above method (1), in detail, method (1) adds up the pixel grey level along individual horizontal lines (i.e. along x direction) to obtain a projection of the imaged patterns (elements 302 and 304) on the y axis in the form of a grey level profile 312. Similarly, the pixel. grey level along individual vertical lines (i.e. along y direction) is added up to obtain a projection of elements 302 and 304 on the x axis in the form of a grey level profile 310. Next, by observing the periodic variation in the x profile 310, an x pattern period (pattern period along the x direction) 306 is obtained. Similarly, a y pattern period 308 can be obtained by observing the y pattern period 312. It is noted that during the addition operation along horizontal or vertical lines, the background noises would be canceling each other because these noises turn up randomly in both positive signals and negative signals. This cancellation effect will be referred to as the "averaging" of the background noises hereinafter. Averaging can be applied in images as well.

It is noted that in practice, the imaged pattern (elements 302 and 304) may not be so perfectly aligned as shown in FIG. 3A and FIG. 3B. In the case of irregularly distributed patterns columns, the pattern columns in the image may first be shifted or re-arranged to align with each other. Such adjustment can be easily done with current imaging processing techniques and will not be discussed in detail here.

It is also rioted that for method (2) to be performed, a specification must be provided, for example, by the customer. Such specification should explicitly indicate that, for example, for a 512×512 image, every 10 pixels along the x direction gives an x pattern period and every 15 pixels along the y direction gives a y pattern period. Then, the x and y pattern period can be identified directly from the image.

Figure 3C:
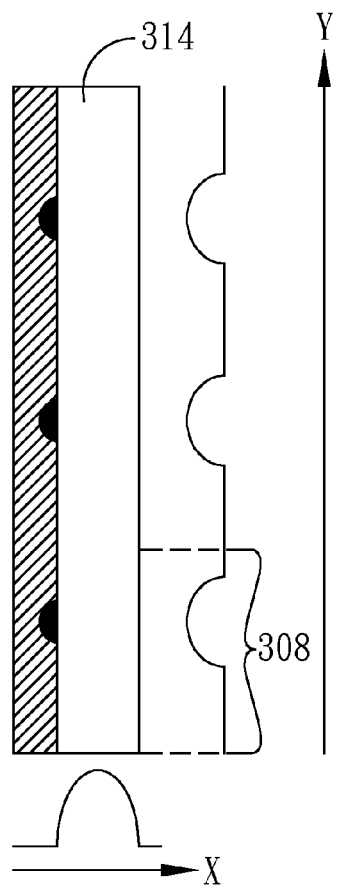
Figure 3D:
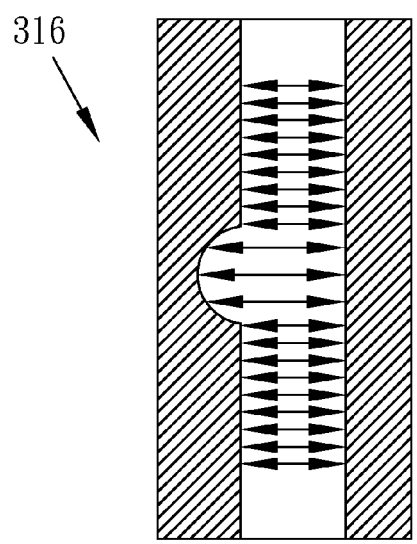
Figure 3E:
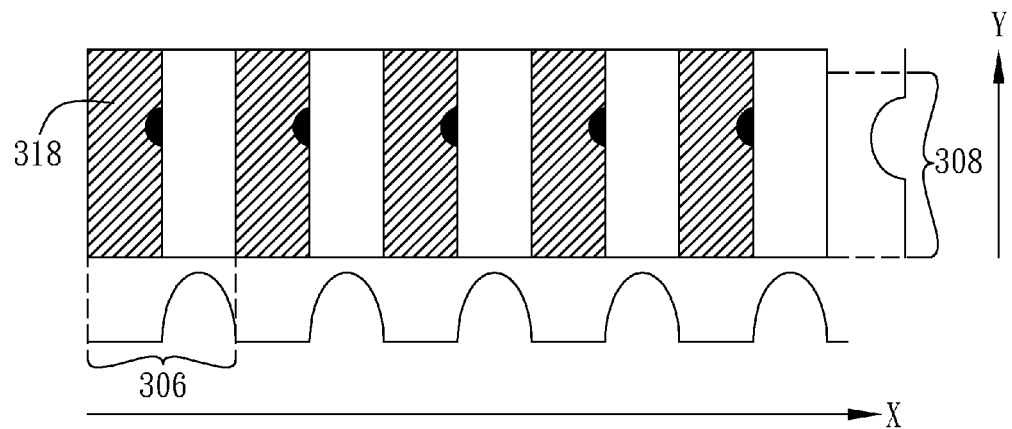

As mentioned above, after individual pattern period 306/308 along the x and y direction has been found, an inspection pattern period can be defined and obtained, and then microscopic image 30 can be averaged using this inspection pattern period. Still referring to FIG. 3B, in this embodiment, microscopic image 30 can first be cut into a plurality of the x periods 306. The individual x period 306 is then added up along the x direction. As a result, a single x period 314 with x-averaged background image noises is obtained, as shown in FIG. 3C. Next, this averaged x period 314 is put into individual y pattern periods 308 which are then added along the y direction to form a y-averaged (recall: now also x-averaged) y pattern period 316, as shown in FIG. 3D. It is noted that the order of the above operation along the x and y direction is exchangeable, for example as shown in FIG. 3E, microscopic image 30 is first averaged along the y-direction to form a row of y period 308 with y-averaged background noises, denoted as 318, and then this row 318 of averaged y pattern periods 308 is averaged along the x-direction, taking x period 306 as a unit, to form the same pattern period 316 in FIG. 3D. In other words, by either way, microscopic image 30 is reduced into pattern period 316 which is both x-averaged and v-averaged. This final pattern period 316 is selected to be the inspection pattern period.

Clearly, as shown in FIG. 3D, inspection, pattern period 316 is preferably selected to include the line-to-plug connection/contact point that is sought to be inspected.

After inspection pattern period 316 has been identified, the width of inspection pattern period 316 can be measured to determine the degree of average overlay shift between the contacting plug and metal line included in inspection pattern period 316, thereby determining if the shift is within tolerable range. For example, the average width of inspection pattern period 316 can be compared with a threshold value, and if the average width of inspection pattern period 316 is equal to or greater than this threshold value, it is determined that an intolerable overlay shift is present, therefore an overlay shift defect is present in the sample being inspected. The threshold value may be provided by the customer.

Figure 3F:
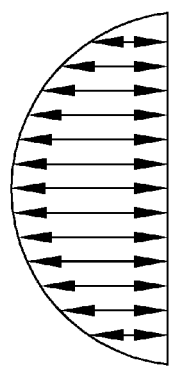

In an alternative embodiment, modification is made to inspection pattern period 316 to further facilitate the determination step. For example, the image of line element 304 can be subtracted from inspection pattern period 316, so that only the exposing protruding element 302 remains for analysis, as shown in FIG. 3F. It is noted that although a 2-dimensional pattern period identification approach is described in this embodiment, it would be understood by those skilled in the field of image processing that multi-dimensional pattern period identification can also be implemented to achieve the same goal of finding inspection pattern period 306.

Figure 4:
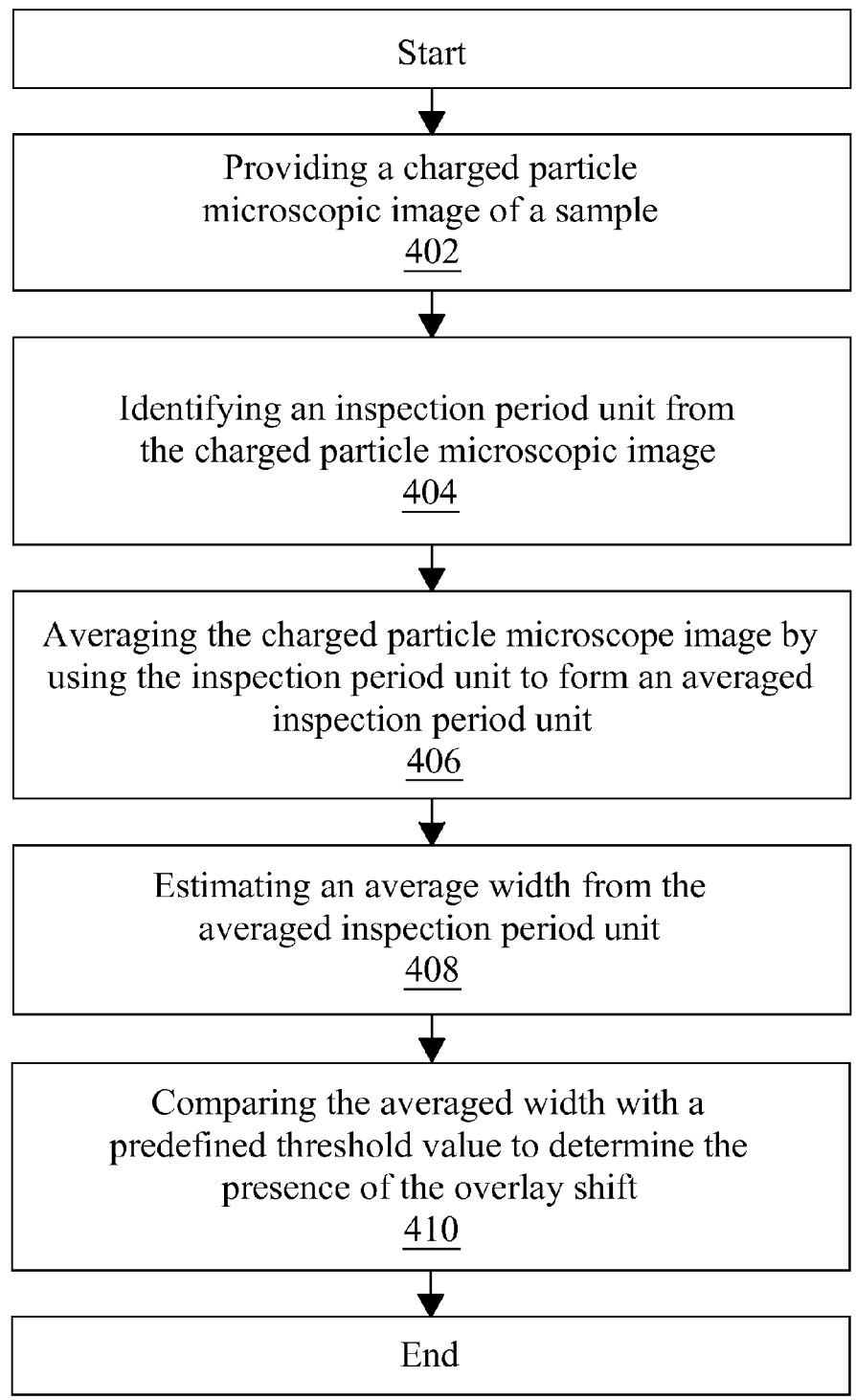
FIG. 4 is a flowchart illustration of a method for inspection of overlay shift defect in accordance with an embodiment of the present invention.

FIG. 4 is a flowchart diagram illustrating the proposed method for inspecting overlay shift defect during semiconductor manufacture in accordance with an embodiment of the present invention. As shown in FIG. 4, the method includes the following steps. In step 402, a charged particle microscopic image of a sample is provided. The sample may be a semiconductor device, such as a dynamic random access memory (DRAM). In step 404, an inspection pattern period is identified from the charged particle microscopic image. In step 406, the charged particle microscopic image is averaged by using the inspection pattern period as a unit to form an averaged inspection pattern period. In step 408, an average width is estimated from the averaged inspection pattern period. Then, in step 410, the average width is compared with a predefined threshold value to determine the presence of an overlay shift defect.

Still referring to FIG. 4, in detail, in one embodiment the identifying step further comprises observing a grey level profile of the patterns displayed in the image. In another embodiment, the identifying step further comprises identifying at least two independent pattern periods, each along a direction predefined in the image. In this case, the inspection pattern period comprises an overlapped portion of the identified independent pattern periods, just as inspection period 316 including an overlapped portion of x and y periods 306 and 308, as illustrated in FIG. 3. To obtain these independent pattern periods, the pixel grey level in the image is added up along each of the predefined directions to obtain a corresponding grey level profile. Then, the independent pattern, periods are identified by observing a periodic variation in the obtained grey level profiles.

In one example of this embodiment, a first and second pattern period along a. first and second direction predefined in the image is respectively identified, just as the acquisition of x and y period 306 and 308 as illustrated in FIG. 3. For instance, the pixel grey level of the image may be added along the first direction to obtain a first grey level profile, and along the second direction to obtain a second grey level profile. The first and second directions may be substantially perpendicular to each other, as the x and y directions as illustrated in FIG. 3. In this case, as described earlier in conjunction with FIG. 3, projection along the first (for example, x) direction forms a grey level profile on the second axis (first grey level profile). Therefore, the first grey level profile is along the second (for example, y) direction. Similarly, projection along the second direction forms a second grey level profile on the first axis (second grey level profile). Therefore, the second grey level profile is along the first direction. Next, the first pattern period is identified by observing a periodic variation in the second grey level profile, and the second pattern period is identified by observing a periodic variation in the first grey level profile. The inspection pattern period again includes an overlapped portion of the identified first and second pattern period.

After the inspection pattern period is identified, in the averaging step the pixel grey level may be added up, pixel by pixel, over the entire image taking the inspection pattern period as a unit of addition. For example, the pixel grey level may be added along the first and then the second direction, or the second and then the first direction, respectively.

The inspection pattern period may comprise a contact point of a contact/via plug with a conducting line formed in successive layer structures as part of the sample. In such case, for the purpose of inspection of overlay shift defect, the image of the sample should be taken after the formation of the two successive layer structures, with one on top of the other, as part of the sample. Moreover, the upper layer structure should comprise the conducting line and the bottom layer structure should comprise the contact/via plug. In one embodiment, the sample is a dynamic random access memory (DRAM) device which comprises the above layered structures.

Figure 5:
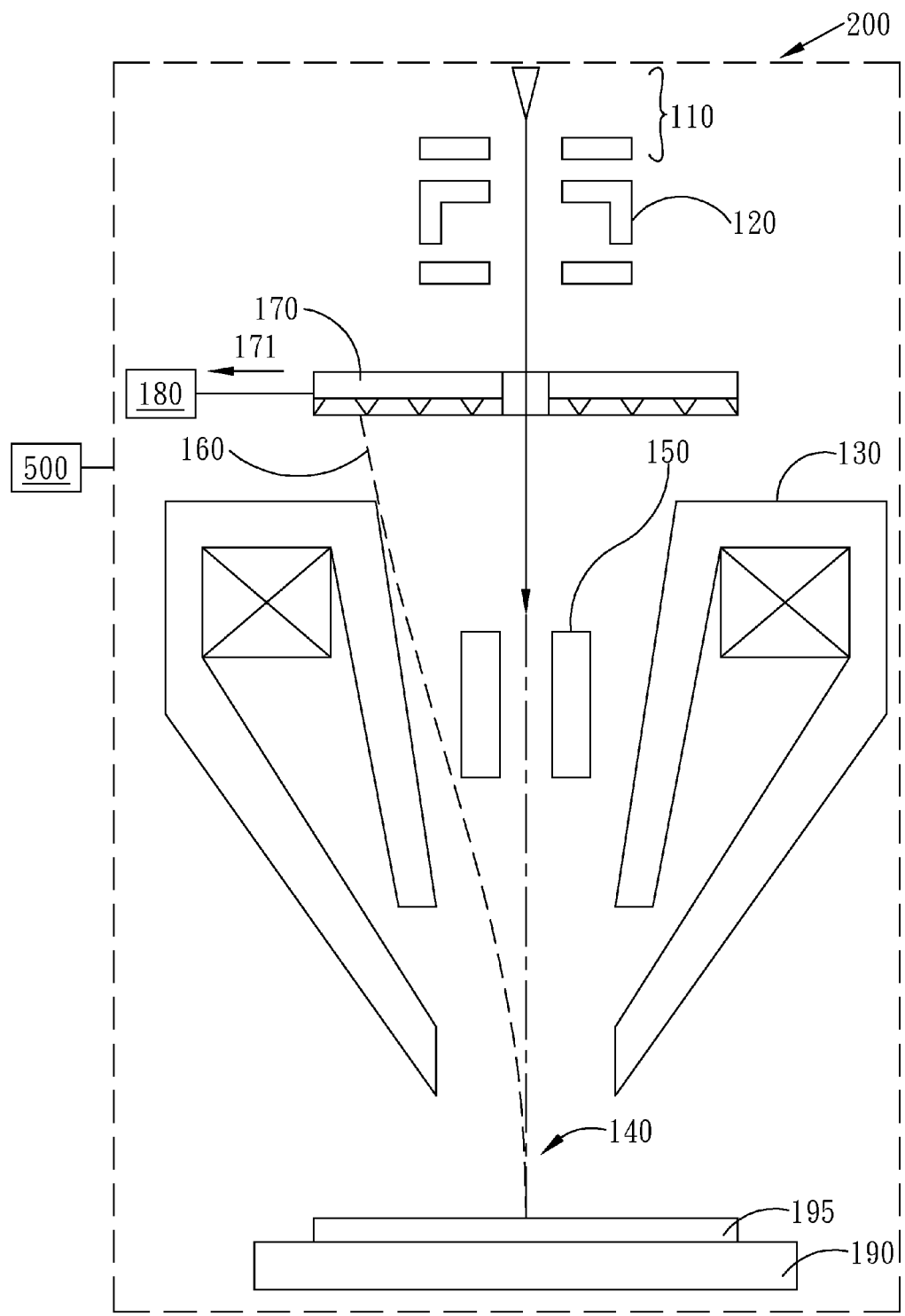
FIG. 5 illustrates a computing agent coupled to a conventional charged particle microscope system as in accordance with an embodiment of the present invention.

In one embodiment, the proposed method is implemented as an independent computing agent which is able to analyze images taken by a general/conventional charged particle beam microscope system. FIG. 5 illustrates a computing agent 500 coupled to the conventional charged particle microscope system 200 of FIG. 2. In one example of the present invention, computing agent 500 is coupled to image forming module 280 of charged particle microscope system 200 for receiving images of the sample being inspected (sample 295) therefrom. Computing agent 500 may be implemented in hardware, firmware, software, or any combination thereof. For example, it may be implemented as an independent IC, or a computer readable medium encoded with a computer program which is able to execute the steps of the proposed method.

Figure 6:
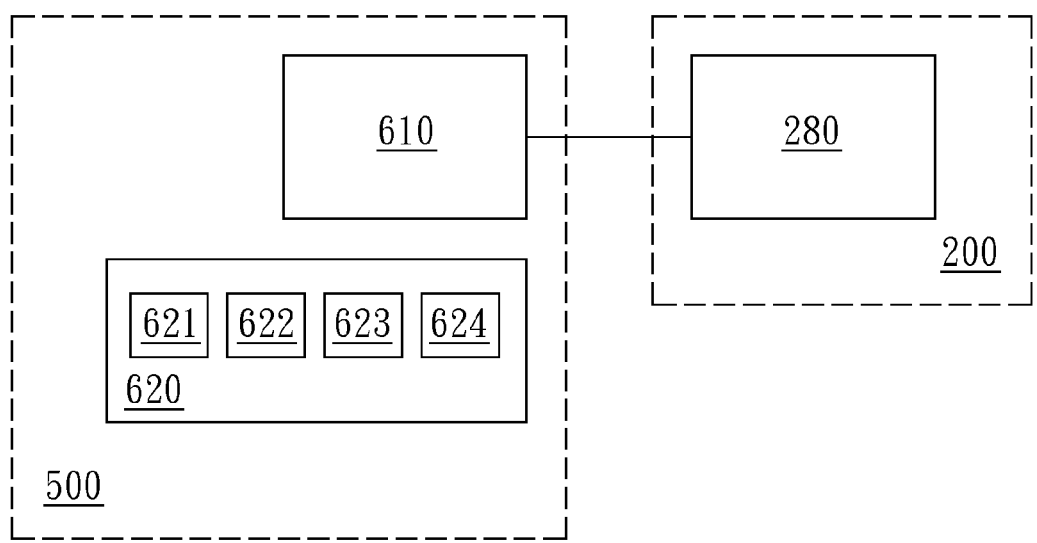
FIG. 6 is a schematic block diagram of a computing agent in accordance with an embodiment of the present invention.

FIG. 6 is a schematic block diagram of computing agent 500 in accordance with an embodiment of the present invention. As shown, computing agent 500 may at least comprise an input module 610 and a computing module 620. Input module 610 may be used to couple to, for example, image forming module 280 of charged particle microscope system 200 so that computing agent 500 receives images of the interested sample 295 from charged. particle microscope system 200. Computing module 620 is coupled with input module 610 to receive information of the images therefrom for further processing and analysis. As shown in FIG. 6, computing module 620 may further comprise a pattern identifying member 621, an image averaging member 622, an estimating member 623 and a defect determination member 624. The pattern identifying member 621 is used for identifying an inspection pattern period from the image. The image averaging member 622 is used for averaging the image taking the identified inspection pattern period as a unit so as to reduce the image into an averaged inspection pattern period. The estimating member 623 is used for estimating an average width of the averaged inspection pattern period. The defect determination member 624 is used for comparing the estimated average width with a threshold value thereby determining the presence of misalignment of the successive photolithographic masks. If the average width is equal to or greater than the threshold value, it is determined that the misalignment of the successive photolithographic masks is present. Otherwise, it is determined that the misalignment of the successive photolithographic masks is not present.

Figure 7:
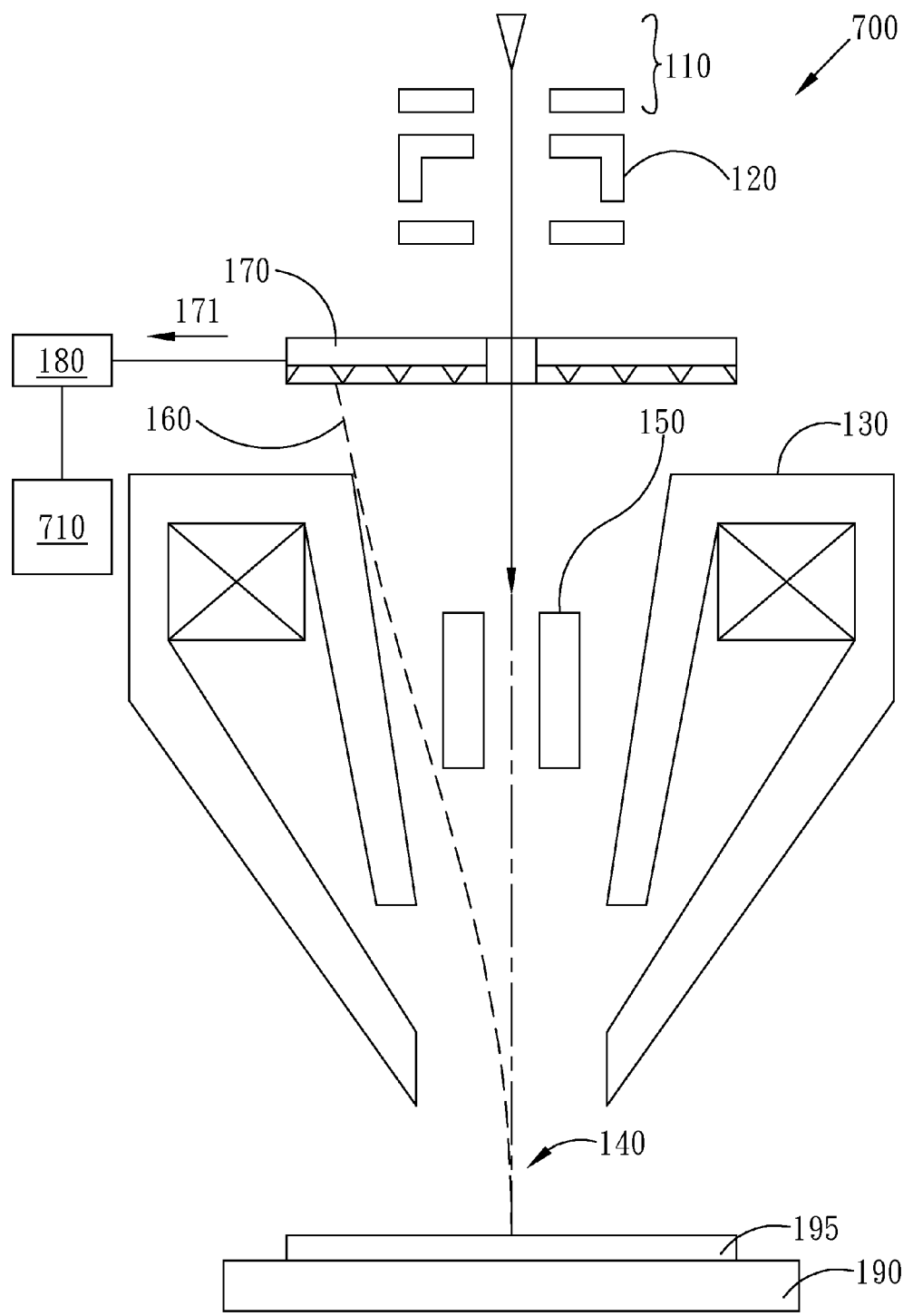
FIG. 7 is an illustration of a charged particle beam inspection system in accordance with an embodiment of the present invention.

In one embodiment, a charged particle inspection system capable of inspecting misalignment of photolithographic masks from a charged particle microscopic image is disclosed. FIG. 7 is an illustration of a charged particle beam inspection system 700 in accordance with an embodiment of the present invention. As shown, charged particle beam inspection system 700 at least comprises a conventional charged particle microscope system such as charged particle microscope system 200 described in conjunction with FIG. 2, and an image analysis apparatus 710 coupled thereto. The details of the physical design and operation of charged particle microscope system 200 have been described earlier and will not be repeated here.

Image analysis apparatus 710 may be implemented in hardware, firmware, software, or any combination thereof. For example, it may be implemented as an independent IC, or a computer readable medium encoded with a computer program which is able to execute the steps of the proposed inspection method. It is noted that when implemented in hardware, the physical design and operation of image analysis apparatus 710 may be an implementation similar to computing agent 500 as described earlier in conjunction with FIG. 5 and FIG. 6.

Figure 8A:
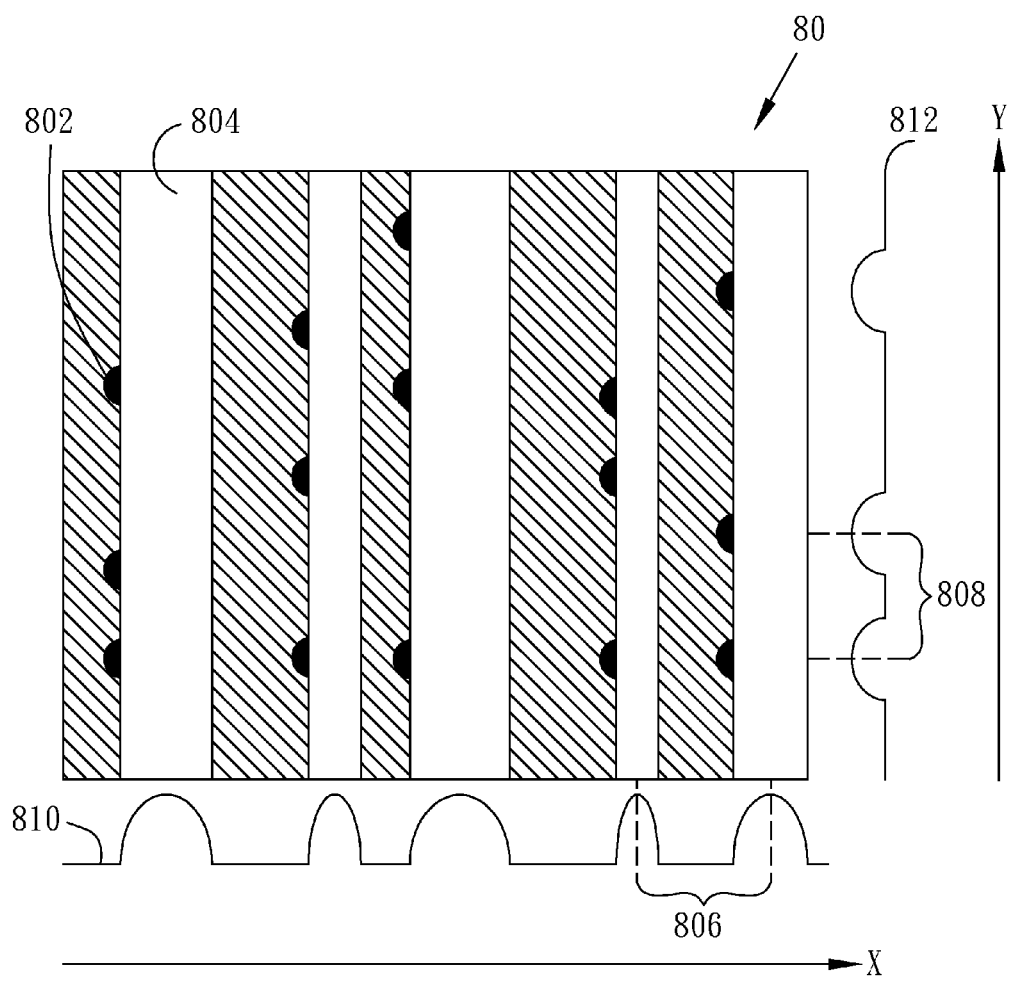
FIG. 8A-FIG. 8E illustrate the execution of a method for inspection of overlay shift defect in accordance with another embodiment of the present invention.

In another embodiment of this invention, we can use different non-repeat pattern's measurement result to get average to figure out mask overlay shift value. FIG. 8A-FIG. 8E illustrate the execution of this method for inspection of overlay shift defect with different non-repeat pattern's measurement. Referring to FIG. 8A, firstly, a charged particle microscopic image of a wafer is provided in this method. The charged particle microscopic image 80 represents top view of a layered structure such as that in FIG. 1 in order to detect the overlay shift defect between a contact/via plug and a metal line in a semiconductor device, for example a dynamic random access memory (DRAM). The charged particle microscopic image 80 is composed of non-repeat patterns and the charged particle microscopic image 80 comprises protruding elements 802 extending from line elements 804. The protruding elements 802 and the line elements 804 in the charged particle microscope image 80 respectively represent the via/contact plugs and metal lines in the semiconductor device sample. It is noted that microscopic image 80 in FIG. 8A is a high resolution charged particle microscopic image of the sample. In practice, it may also be in other formats such as a voltage contrast (VC) image, where elements 802 and 804 are represented in pixel grey levels.

For the purpose of detecting the overlay shift defect (misalignment of photolithographic masks), an important step is to identify a non-repeating pattern measure unit from the image, so that further analysis of this unit can be carried out through image processing. This can be done in two ways: (1) projecting the imaged pattern (elements 802 and 804) to at least two arbitrary axes, for example the x and y axis shown in FIG. 8A, to identify a pattern measure along respective axis, or (2) if a pattern specification, for example a GDS file or database layout of the sample being inspected is available, the specification can be used as a reference to identify pattern, measures, for example again respectively along at least two arbitrary axes, such as the x and y axis shown in FIG. 8A. Then, a proper inspection pattern measure can be identified by observing and calculating these sub-pattern measures.

FIG. 8A illustrates the above method (1). In detail, method (1) adds up the pixel grey level along individual horizontal lines (i.e. along x direction) to obtain a projection of the imaged patterns (elements 802 and 804) on the y axis in the form of a grey level profile 812. Similarly, the pixel grey level along individual vertical lines (i.e. along y direction) is added up to obtain a projection of elements 802 and 804 on the x axis in the form of a grey level profile 810. Next, by calculating and observing the statistic variation in the x profile 810, an x pattern measure (pattern measure along the x direction) 806 is obtained. Similarly, a y pattern measure 808 can be obtained by calculating and observing the y profile 812. It is noted that during the addition operation along horizontal or vertical lines, the background noises would be canceling each other because these noises turn up randomly in both positive signals and negative signals. This cancellation effect will be referred to as the "averaging" of the background noises hereinafter. Averaging can be applied in images too.

It is also noted that for method (2) to be performed, a specification must be provided, for example, by the customer. Such specification should explicitly indicate that, for example, for a 512×512 image, every 10 pixels along the x direction gives an x pattern measure and every 15 pixels along the y direction gives a y pattern measure. Then, the x and y pattern measure can be identified directly from the image.

Figure 8C:
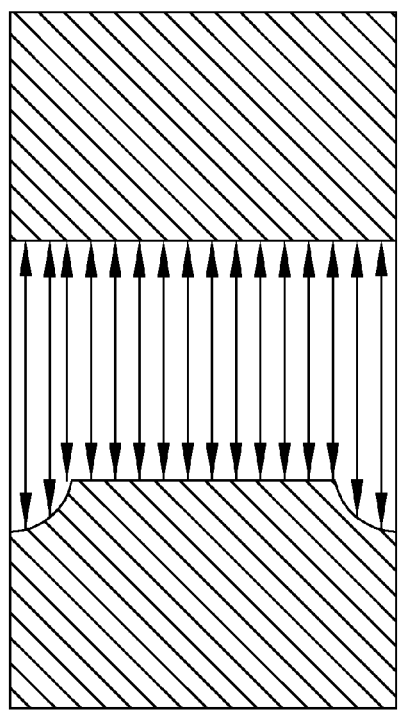
Figure 8B:
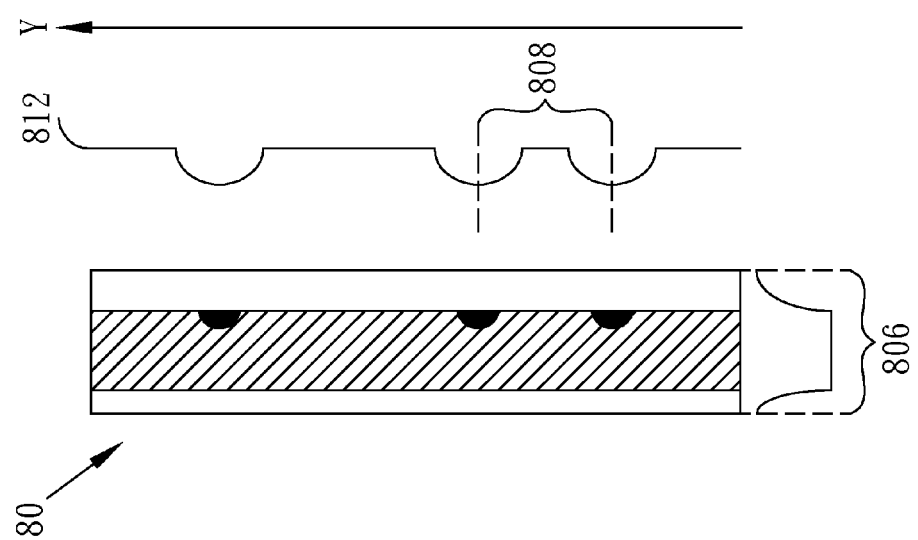
Figure 8D:
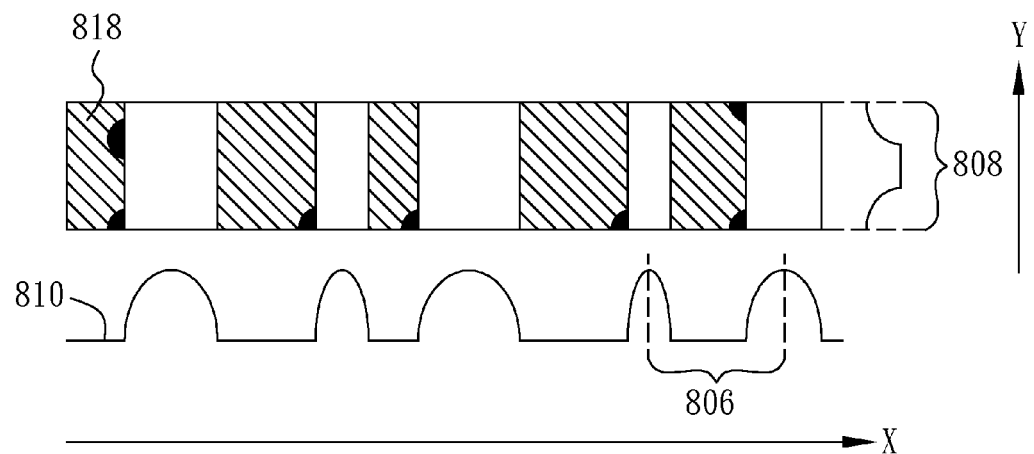

As mentioned previously, after individual pattern measure 806/808 along the x and y direction has been found, an inspection pattern measure can be defined and obtained, and then microscopic image 80 can be averaged using this inspection pattern measure. Still referring to FIG. 8A, in this embodiment, microscopic image 80 can first be cut into a plurality of the x measures 806. The individual x measure 806 is then added up along the x direction. As a result, a single x measure 814 with x-averaged background image noises is obtained, as shown in FIG. 8B. Next, this averaged x measure 814 is cut into individual y pattern measures 808 which are then added along the y direction to form a y-averaged (recall: now also x-averaged) y pattern measure 816, as shown in FIG. 8C. It is noted that the order of the above operation along the x and y direction is exchangeable, for example as shown in FIG. 8D, microscopic image 80 is first averaged along the y-direction to form a row of y measure 808 with y-averaged background noises, denoted as 818, and then this row 818 of averaged y pattern measures 808 is averaged along the x-direction, taking x measure 806 as a unit, to form the same pattern measure 816 in FIG. 8C. In other words, by either way, microscopic image 80 is reduced into pattern measure 816 which is both x-averaged and y-averaged. This final pattern measure 816 is selected to be the inspection pattern measure.

Clearly, as shown in FIG. 8C, inspection pattern measure 816 is preferably selected to include the line-to-plug connection/contact point that is sought to be inspected.

After inspection pattern measure 816 has been identified, the width of inspection pattern measure 816 can be measured to determine the degree of average overlay shift between the contacting plug and metal line included in inspection pattern measure 816, thereby determining if the shift is within tolerable range. For example, the average width of inspection pattern measure 816 can be compared with a threshold value, and if the average width of inspection pattern measure 816 is equal to or greater than this threshold value, it is determined that an intolerable overlay shift is present, therefore an overlay shift defect is present in the sample being inspected. The threshold value may be provided by the customer.

Figure 8E:

In an alternative embodiment, modification is made to inspection pattern measure 816 to further facilitate the determination step. For example, the image of line element 804 can be subtracted from inspection pattern measure 816, so that only the exposing protruding element 802 remains for analysis, as shown in FIG. 8E. It is noted that although a 2-dimensional pattern measure identification approach is described in this embodiment, it would be understood by those skilled in the field of image processing that multi-dimensional pattern measure identification can also be implemented to achieve the same goal of finding inspection pattern measure 806.

Figure 9:
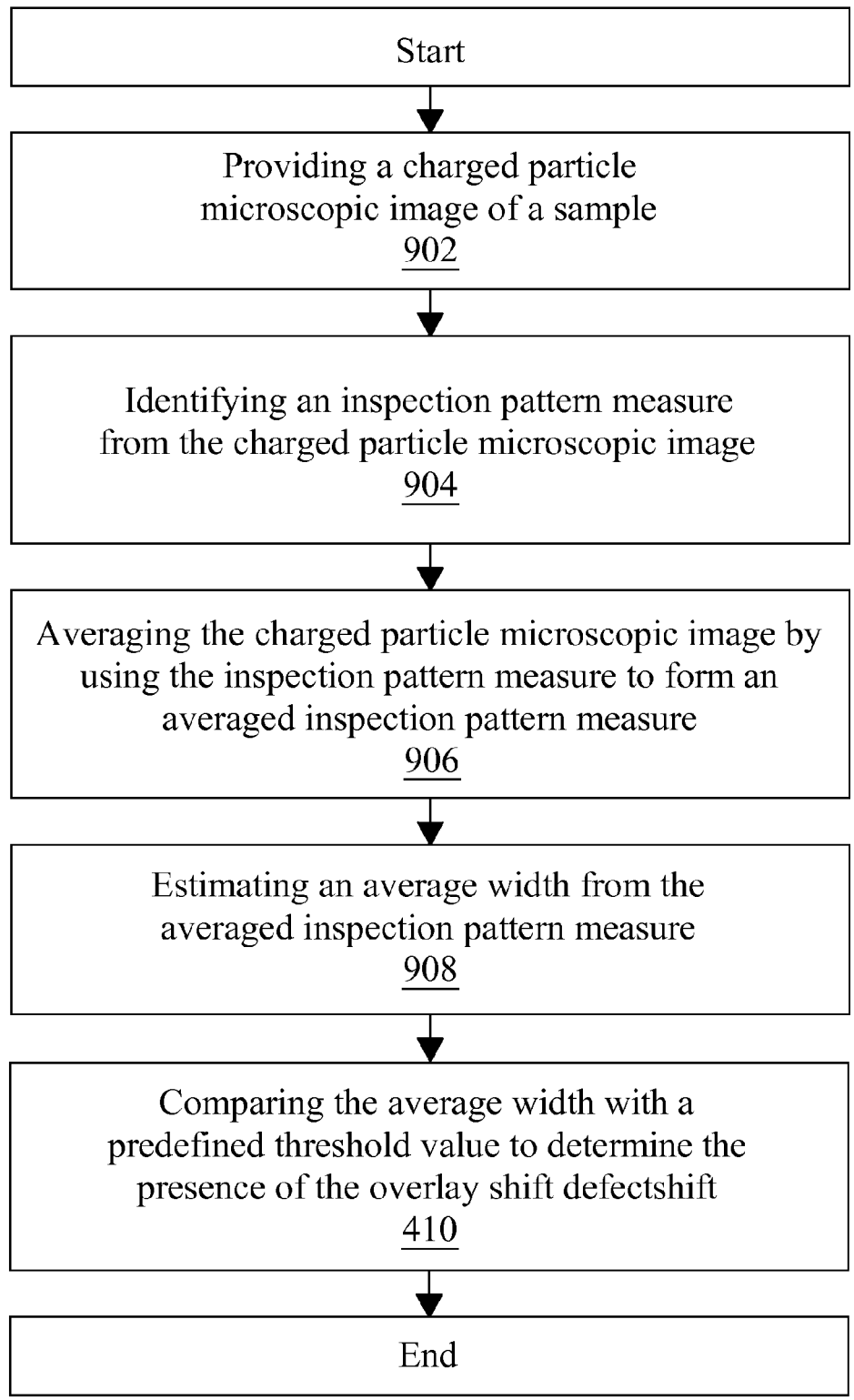
FIG. 9 is a flowchart illustration of a method for inspection of overlay shift defect in accordance with another embodiment of the present invention.

FIG. 9 is a flowchart diagram illustrating the proposed method for inspecting overlay shift defect during semiconductor manufacture in accordance with an embodiment of the present invention. As shown in FIG. 9, the method includes the following steps. In step 902, a charged particle microscopic image of a sample is provided. The sample may be a semiconductor device, such as a dynamic random access memory (DRAM). In step 904, an inspection pattern measure is identified from the charged particle microscopic image. In step 906, the charged particle microscopic image is averaged by using the inspection pattern measure as a unit to form an averaged inspection pattern measure. In step 908, an average width is estimated from the averaged inspection pattern measure. Then, in step 910, the average width is compared with a predefined threshold value to determine the presence of an overlay shift defect.

Still referring to FIG. 9, in detail, in one embodiment the identifying step further comprises observing a grey level profile of the patterns displayed in the image. In another embodiment, the identifying step further comprises identifying at least two independent pattern measures, each along a direction predefined in the image. In this case, the inspection pattern measure comprises an overlapped portion of the identified independent pattern measures, just as inspection measure 816 including an overlapped portion of x and y measures 806 and 808, as illustrated in FIG. 8. To obtain these independent pattern measures, the pixel grey level in the image is added up along each of the predefined directions to obtain a corresponding grey level profile. Then, the independent pattern measures are identified by calculating and observing a statistic variation in the obtained grey level profiles.

In one example of this embodiment, a first and second pattern measure along a first and second direction predefined in the image is respectively identified, just as the acquisition of x and y measure 806 and 808 as illustrated in FIG. 8. For instance, the pixel grey level of the image may be added along the first direction to obtain a first grey level profile, and along the second direction to obtain a second grey level profile. The first and second directions may be substantially perpendicular to each other, as the x and y directions as illustrated in FIG. 8. in this case, as described earlier in conjunction with FIG. 8, projection along the first (for example, x) direction forms a grey level profile on the second axis (first grey level profile). Therefore, the first grey level profile is along the second (for example, y) direction. Similarly, projection along the second direction forms a second grey level profile on the first axis (second grey level profile). Therefore, the second grey level profile is along the first direction. Next, the first pattern measure is identified by calculating and observing a statistic variation in the second grey level profile, and the second pattern measure is identified by calculating and observing a statistic variation in the first grey level profile. The inspection pattern measure again includes an overlapped portion of the identified first and second pattern measure.

After the inspection pattern measure is identified, in the averaging step the pixel grey level may be added up, pixel by pixel, over the entire image taking the inspection pattern measure as a unit of addition. For example, the pixel grey level may be added along the first and then the second direction, or the second and then the first direction, respectively.

The inspection pattern measure may comprise a contact point of a contact/via plug with a conducting line formed in successive layer structures as part of the sample. In such case, for the purpose of inspection of overlay shift defect, the image of the sample should be taken after the formation of the two successive layer structures, with one on top of the other, as part of the sample. Moreover, the upper layer structure should comprise the conducting line and the bottom layer structure should comprise the contact/via plug. In one embodiment, the sample is a dynamic random access memory (DRAM) device which comprises the above layered structures.

Although specific embodiments have been illustrated and described, it will be appreciated by those skilled in the art that various modifications may be made without departing from the scope of the present invention, which is intended to be limited solely by the appended claims.

What is claimed is:

1. A method for inspecting misalignment of photolithographic masks from a charged particle microscopic image, comprising:
   providing a charged particle microscopic image of a sample, said image representing at least two different patterns formed as part of said sample by using two successive photolithographic masks;
   identifying an inspection pattern measure from said image, said inspection pattern measure comprising a contact point of said two patterns;
   averaging said image taking said inspection pattern measure as a unit so as to reduce said image into an averaged said inspection pattern measure;
   estimating an average width of averaged said inspection pattern measure; and
   comparing said average width with a threshold value thereby determining the presence of misalignment of said successive photolithographic masks.

2. The method of claim 1, wherein said identifying step further comprises observing a grey level profile of said patterns displayed in said image.

3. The method of claim 1, wherein said identifying step further comprises identifying at least two independent pattern measures along respectively corresponding directions predefined in said image,
   and wherein said inspection pattern measure comprises an overlapped portion of said independent pattern measures.

4. The method of claim 3, wherein said identifying step further comprises adding up a pixel grey level along each of said directions to obtain a corresponding grey level profile,
   and wherein said independent pattern measures are identified by observing a periodic variation in said grey level profiles.

5. The method of claim 1, wherein said identifying step further comprises identifying a first and second pattern measure along a first and second direction predefined in said image,
and wherein said inspection pattern measure comprises an overlapped portion of said first and second pattern measure.

6. The method of claim 5, wherein said identifying step further comprises:
adding up a pixel grey level along said first direction to obtain a first grey level profile along said second direction; and
adding up said pixel grey level along said second direction to obtain a second grey level profile along said first direction,
wherein said first pattern measure is identified by observing a periodic variation in said second grey level profile, and said second pattern measure is identified by observing a periodic variation in said first grey level profile.

7. The method of claim 5, wherein said first and second directions are substantially perpendicular to each other.

8. The method of claim 1, wherein said averaging step further comprises adding up a pixel grey level over said image taking said inspection pattern measure as a unit of addition.

9. The method of claim 1, wherein said averaging step further comprises adding up a pixel grey level respectively along a first and a second direction taking said inspection pattern measure as a unit of addition.

10. The method of claim 9, wherein said first and second directions are substantially perpendicular to each other.

11. The method of claim 1, wherein said inspection pattern measure in said image comprises a contact point of a contact/via plug with a conducting line formed in successive layer structures as part of said sample.

12. The method of claim 1, wherein said image of said sample is taken after formation of two successive layer structures, with one on top of the other, as part of said sample,
and wherein the upper layer structure comprises a conducting line and the bottom layer structure comprises a contact/via plug.

13. The method of claim 1, wherein said sample comprises a Dynamic Random Access Memory (DRAM).

14. A charged particle beam inspection system, comprising:
an image forming apparatus for forming a charged particle microscopic image of a sample, said image representing at least two different patterns formed as part of said sample by using two successive photolithographic masks;
an image analysis apparatus coupled with said image forming apparatus for receiving said image therefrom, said image analysis apparatus at least comprising:
a pattern identifying member for identifying an inspection pattern measure from said image, said inspection pattern measure comprising a contact point of said two patterns;
an image averaging member for averaging said image taking said inspection pattern measure as a unit so as to reduce said image into an averaged said inspection pattern measure;
an estimating member for estimating an average width of averaged said inspection pattern measure; and
a defect determination member for comparing said average width with a threshold value thereby determining the presence of misalignment of said successive photolithographic masks.

15. The system of claim 14, wherein said pattern identifying member identifies a first and second pattern measure along a first and second direction predefined in said image,
and wherein said inspection pattern measure comprises an overlapped portion of said first and second pattern measure.

16. The system of claim 15, wherein said pattern identifying member adds up a pixel grey level along said first and second direction to obtain a first grey level profile along said second direction and a second grey level profile along said first direction,
wherein said first pattern measure is identified by observing a periodic variation in said second grey level profile, and said second pattern measure is identified by observing a periodic variation in said first grey level profile.

17. The system of claim 15, wherein said first and second directions are substantially perpendicular to each other.

18. The system of claim 14, wherein said image averaging member adds up a pixel grey level over said image taking said inspection pattern measure as a unit of addition.

19. The system of claim 14, wherein said image of said sample is taken after formation of two successive layer structures as part of said sample with one on top of the other,
and wherein the upper layer structure comprises a conducting line and the bottom layer structure comprises a contact/via plug.

20. A computing agent for inspecting misalignment of photolithographic masks from a charged particle microscopic image, comprising:
an input module coupled with a charged particle beam microscope system for receiving therefrom a charged particle microscopic image of a sample,
wherein said image is formed by said charged particle beam microscope system, and said image represents at least two patterns formed as part of said sample by using two successive photolithographic masks;
a computing module coupled with said input module for receiving information of said image therefrom, said computing module at least comprising:
a pattern identifying member for identifying an inspection pattern measure from said image, said inspection pattern measure comprising a contact point of two said patterns;
an image averaging member for averaging said image taking said inspection pattern measure as a unit so as to reduce said image into an averaged said inspection pattern measure;
an estimating member for estimating an average width of averaged said inspection pattern measure; and
a defect determination member for comparing said average width with a threshold value thereby determining the presence of misalignment of said successive photolithographic masks.

21. The computing agent of claim 20, wherein said pattern identifying member identifies a first and second pattern measure along a first and second direction predefined in said image,
and wherein said inspection pattern measure comprises an overlapped portion of said first and second pattern measure.

22. The computing agent of claim 21, wherein said pattern identifying member adds up a pixel grey level along said first and second direction to obtain a first grey level profile along said second direction and a second grey level profile along said first direction,
wherein said first pattern measure is identified by observing a periodic variation in said second grey level profile, and said second pattern measure is identified by observing a periodic variation in said first grey level profile.

23. The computing agent of claim 21, wherein said first and second directions are substantially perpendicular to each other.

24. The computing agent of claim 20, wherein said image averaging member adds up a pixel grey level over said image taking said inspection pattern measure as a unit of addition.

25. The computing agent of claim 20, wherein said image of said sample is taken after formation of two successive layer structures as part of said sample with one on top of the other,
and wherein the upper layer structure comprises a conducting line and the bottom layer structure comprises a contact/via plug.

* * * * *